United States Patent [19]

Zandonatti

[11] Patent Number: 4,491,788
[45] Date of Patent: Jan. 1, 1985

[54] MINIATURE ELECTRICAL PROBE

[75] Inventor: Raymond A. Zandonatti, Beaverton, Oreg.

[73] Assignee: Tektronix, Inc., Beaverton, Oreg.

[21] Appl. No.: 286,447

[22] Filed: Jul. 27, 1981

[51] Int. Cl.³ .............................................. G01R 1/06
[52] U.S. Cl. .................................. 324/72.5; 294/116; 324/149
[58] Field of Search ................. 324/127, 158 P, 72.5, 324/149, 129; 294/100, 116, 118, 11, 30; 339/108 TP

[56] References Cited
FOREIGN PATENT DOCUMENTS
211427 10/1960 Austria .............................. 324/127

Primary Examiner—Ernest F. Karlsen
Attorney, Agent, or Firm—George T. Noe

[57] ABSTRACT

A miniature electrical probe is provided with a pair of rotatable elongate tip electrodes for gripping a wire or component lead. In one embodiment, a sliding collar provides an operating mechanism for opening and closing the tips, and in a second embodiment, a lever provides an operating mechanism.

4 Claims, 6 Drawing Figures

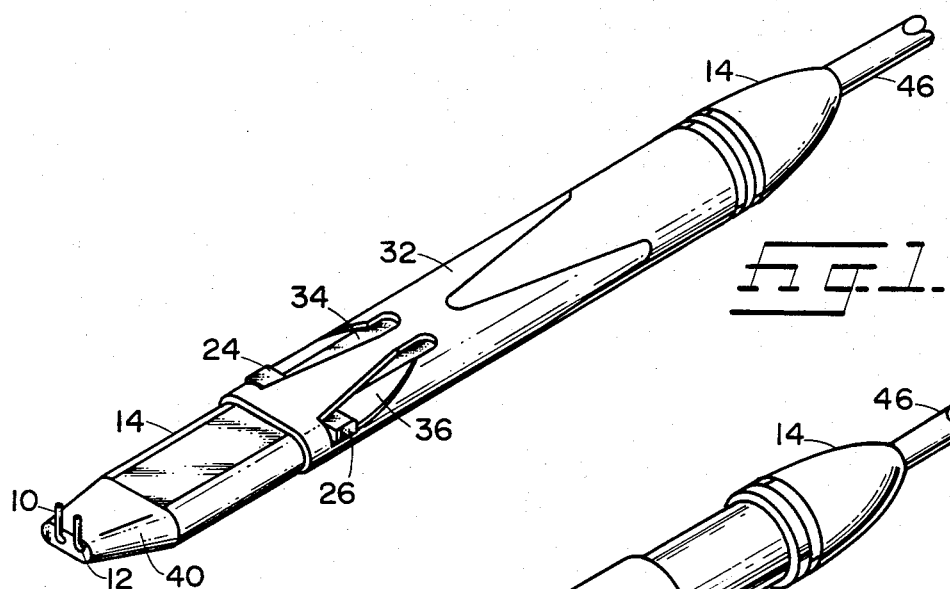
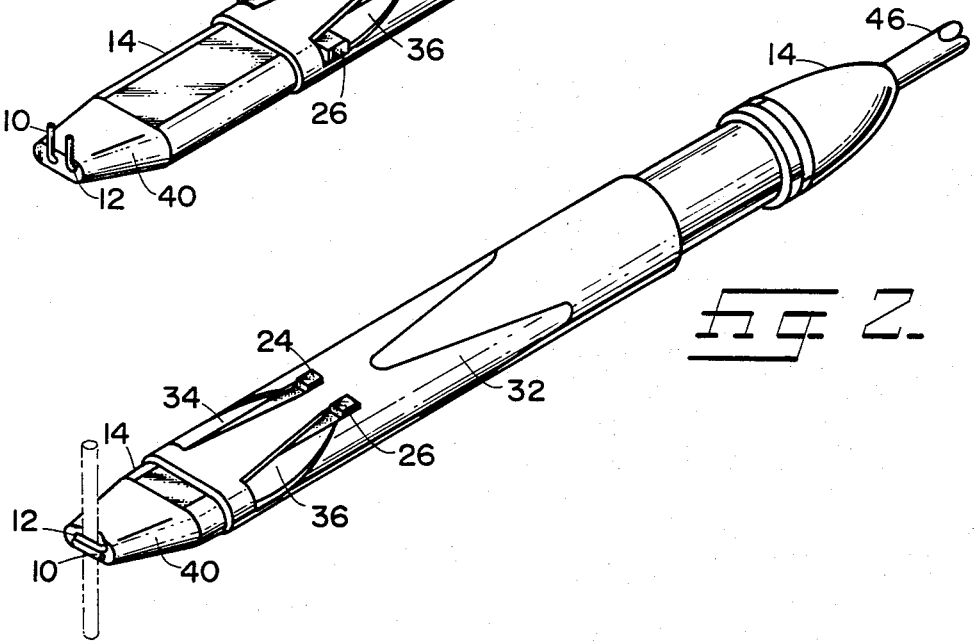
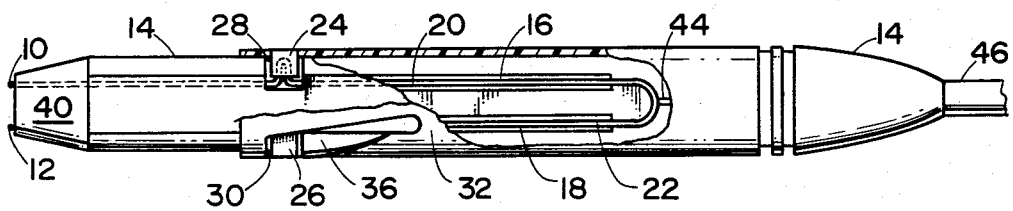

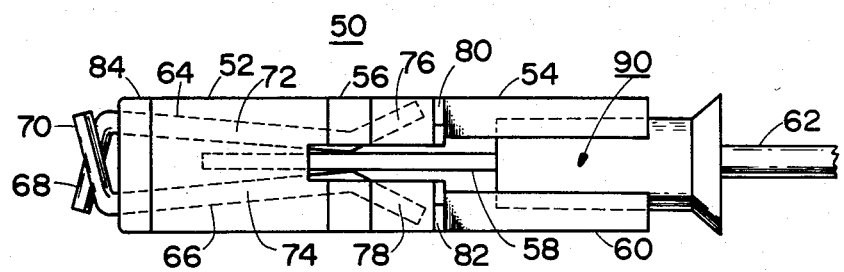
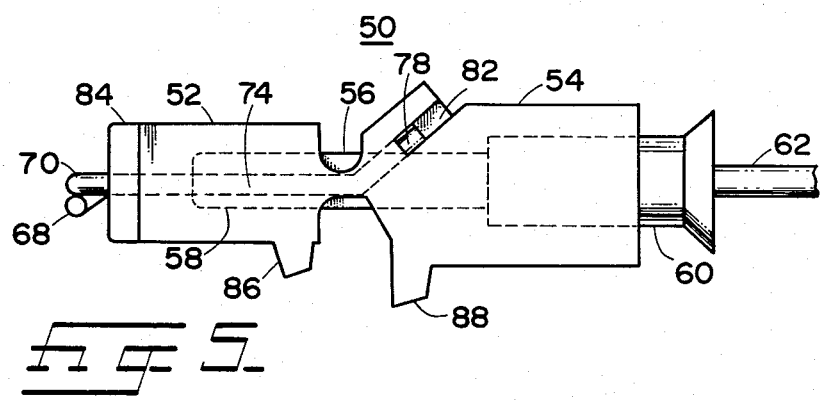
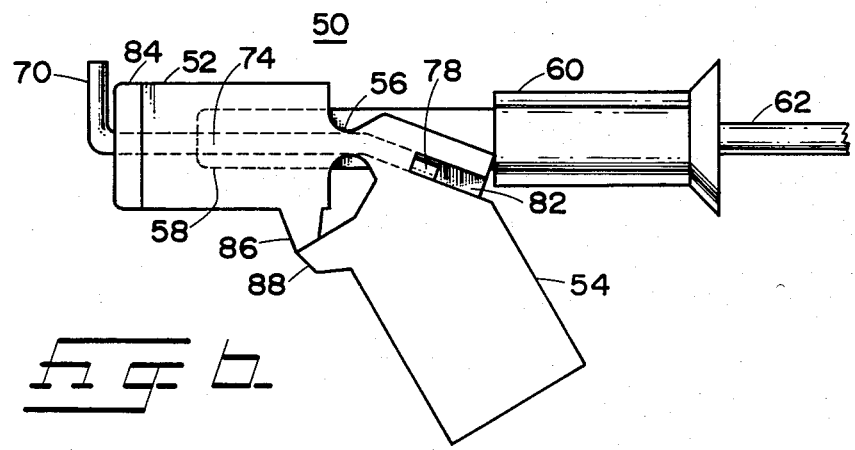
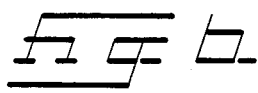

MINIATURE ELECTRICAL PROBE

BACKGROUND OF THE INVENTION

This invention relates generally to electrical test probes, and in particular to a miniature electrical test probe having a pair of adjustable probe tips for gripping a wire or component lead.

For some types of circuits, it is desirable to view several signals simultaneously on a display device. This is particularly true in the case of logic signals because often it is the timing relationship between several signals that yields meaningful information. It has become a common practice to provide a multiple-channel display apparatus, such as an oscilloscope or a logic analyzer, with a probe pod to which a plurality of test probes may be attached. Probes typically used for this purpose are substantially reduced in size as compared with conventional general purpose electrical test probes; however, they are still quite large compared with the miniaturized circuits to which they are connected. Also, such prior art probes employ conventional probe tip features, such as spring-loaded hooks or pincers, proportionately reduced in size. These conventional probe tips are difficult to connect and disconnect in high-density circuit situations, as is the case with dual-inline-package (DIP) integrated circuits, because adjacent wires or leads may be touched by the probe tip at the same time the wire of interest is touched, causing a short circuit which may in turn result in catastrophic failure of one or more expensive circuit components.

SUMMARY OF THE INVENTION

In accordance with the present invention, a miniature electrical probe is provided with a pair of rotatable elongate tip electrodes for gripping a wire or component lead. The tip electrodes are spaced apart and each is at substantially a right angle to the longitudinal axis of the probe body. In the open position, both tip electrodes are substantially parallel to each other. They are rotated 90 degrees toward each other to establish the closed position in which they capture the wire and grip it. The gripping action is partly effected by a resilient member, or snubber, disposed at the probe tip between the probe body and the tip electrodes. The wire or component lead is actually pressed into the snubber before the tip electrodes are rotated in the closed position. The combined effect of the snubber and the rotating tip electrodes is that accidental short circuits are obviated while connecting or disconnecting the probe to a wire or component lead, and during the time that the probe is actually connected.

In one embodiment, a mechanism for rotating the tip electrodes includes ramped cam surfaces on a sliding collar which engage cam arms formed in the longitudinal axes of the tip electrodes, causing the cam arms to rotate inwardly toward each other as the collar is moved longitudinally toward the probe tip. When the collar is retracted, the cam arms rotate outwardly away from each other.

In another embodiment, a one-piece plastic probe body comprises a stationary section and a lever section separated by an integral hinge. The two electrodes pass longitudinally through the stationary section and are terminated in the lever section. A slight angle is formed in each electrode proximate the hinge, and the resulting lever arm in each electrode is fitted into an associated slot in the lever. When the lever is moved away from the center longitudinal axis of the probe, the lever arms are carried with it, rotating the tips inwardly toward each other.

The probe body may be constructed of lightweight plastic, and may be less than a half inch in length, providing an extremely lightweight miniature probe for gripping wires or component leads.

It is therefore one object of the present invention to provide a miniature electrical test probe having a pair of rotatable tip electrodes for gripping a wire or component lead.

It is another object to provide a probe which may be connected or disconnected to a circuit without touching adjacent conductors and thereby causing short circuits.

It is a further object to provide a miniature electrical test probe which may be connected or disconnected in a simple manner.

It is an additional object to provide a novel test probe having a gripping tip.

Other objects and advantages of the present invention will become apparent to those having skill in the art upon a reading of the following description taken in conjunction with the drawings.

BRIEF DESCRIPTION OF THE DRAWINGS

FIGS. 1 and 2 are isometric views of one embodiment of a miniature electrical probe in accordance with the present invention showing the open and closed positions, respectively;

FIG. 3 is a cutaway view of the probe of FIGS. 1 and 2;

FIG. 4 is a top view of a second embodiment of a miniature electrical probe in accordance with the present invention; and FIGS. 5 and 6 are side views of the probe of FIG. 4 showing the open and closed positions, respectively.

DETAILED DESCRIPTION OF THE INVENTION

FIGS. 1, 2, and 3 show one embodiment of the present invention which is designed to grip a wire or a component lead. A pair of elongate rotatable tip electrodes 10 and 12, each having a free end and a pivotal end, extend from an insulative body 14 in a spaced-apart relationship at the pivotal ends and are disposed at a substantially right angle to the longitudinal axis of the body. The body 14 may be constructed of any suitable non-conductive material, such as plastic. A pair of elongate hollow cavities 16 and 18 are disposed parallel to each other and to the longitudinal axis of the probe body 14, and longitudinal conductive portions 20 and 22 of the tip electrodes are disposed within the cavities. Cam arms 24 and 26 are formed in the longitudinal axes of the tip electrode longitudinal portions 20 and 22, respectively, and the cam arms project from openings 28 and 30 in the body 14. The openings 28 and 30 should be kept as small as possible, and the cam arms 24 and 26 may be covered with insulative material to reduce the possibility of shock hazard. Also, the edges of openings 28 and 30 form thrust surfaces to prevent longitudinal movement of the tip electrode portions 20 and 22.

A sliding control member or collar 32 is fitted over the body 14 in telescope fashion and has a pair of slotted openings 34 and 36 therein which are opposite each other at the forward end of such openings and spiral toward each other at the rear of such openings. The cam arms 24 and 26 are fitted into the slotted openings 34 and 36, and thus collar 32 forms an operating mechanism for simultaneously rotating the tip electrodes 10 and 12 through 90-degree arcs to effect the open and closed positions of the probe. When the collar 32 is in a retracted position as shown in FIG. 1, the cam arms 24 and 26 are at the forward ends of slotted openings 34 and 36, and the tip electrodes 10 and 12 are parallel to each other. As the collar 32 is slid forward, the cam arms 24 and 26 engage the ramped cam surfaces of the edges of the slotted openings 34 and 36 and rotate inwardly toward each other as the collar 32 is moved longitudinally toward the probe tip, thereby causing the tip electrodes 10 and 12 simultaneously to rotate 90 degrees to the gripping position shown in FIG. 2.

A resilient member, or snubber 40 is disposed between the body 14 and the tip electrodes 10 and 12 to partly effect the gripping action. When the tip electrodes are in the closed position as shown in FIG. 2, the wire or member being gripped is pressed into the snubber, deforming it. However, the snubber is not permanently deformable, being fashioned of a soft, resilient material such as soft plastic or elastomer, and springs back to its original shape when the probe tips are opened.

The construction details can be seen in FIG. 3, which shows partial cutaway views of the collar 32 and body 14. The entire tip electrode assembly including the tip electrodes 10 and 12, the longitudinal conductive portions 20 and 22, and the cam arms 24 and 26 may be formed from a single piece wire to facilitate a simple and inexpensive fabrication process. Electrical contact may then be made with the center conductor 44 of a cable 46 as shown.

A second embodiment of the gripping probe is shown in FIGS. 4, 5, and 6. FIG. 4 shows a top view of the probe, while FIGS. 5 and 6 show side views in closed and opened positions, respectively. An insulative probe body 50 comprising a stationary section 52 and a lever 54 separated by an integral hinge 56 is constructed as a single unit from a non-conductive material, such as plastic. A flat conductive member 58 is attached to a ferrule 60 and inserted into the probe body stationary section 52. An insulated wire 62 is inserted into the ferrule 60 and attached by any of the conventional methods, such as soldering or crimping. The lever 54 may be designed to snap onto the ferrule 60 so as to effectuate locking the probe in the closed position.

A pair of rotatable electrodes 64 and 66, formed by bending wire to provide tip electrodes 68 and 70, longitudinal sections 72 and 74, and lever sections 76 and 78, are disposed in the stationary body section 52 with the lever sections 76 and 78 being engaged by slots 80 and 82 in the lever 54. The electrodes 64 and 66 are in electrical contact with the flat conductive plate 58. A resilient snubber 84 is disposed between the stationary section 52 of the probe body 50 and the tip electrodes 68 and 70 to facilitate a gripping action as discussed hereinabove.

The tip electrodes 68 and 70 are rotated into an open position when lever 54 is moved away from the longitudinal axis of the probe body, as shown in FIG. 6. A pair of projections 86 and 88 provide a stop in the open position at the point at which the two tip electrodes 68 and 70 are parallel. Returning the lever 54 to the longitudinal axis of the probe body causes the tip electrodes 68 and 70 to rotate toward each other through 90-degree arcs to provide a closed position of the probe as shown in FIGS. 4 and 5. The top of a slotted opening 90 in lever 54 may be slightly narrower than the ferrule 60 effectuate a snap-action locking of the lever in the closed position of the probe.

It will therefore be appreciated that a novel and unique electrical probe has been disclosed, and that the aforementioned and other objects have been achieved. However, it should be emphasized that the particular embodiments of the ivention, which are shown and described herein, are intended as merely illustrative and not as restrictive of the invention.

What I claim as my invention is:

1. An electrical probe, comprising:
   an insulative body having a longitudinal axis;
   a pair of rotatable tip electrodes extending from said body, said tip electrodes being spaced apart at a pivotal end and being disposed at substantially a right angle to the longitudinal axis of said body; and
   means for simultaneously rotating said tips, wherein said tips are substantially parallel in the open position of said probe and being rotated toward each other through a substantially ninety-detree arc to provide a gripping function in the closed position of said probe.

2. A probe in accordance with claim 1 further comprising a resilient member disposed between said body and said tip electrodes.

3. A probe in accordance with claim 1 wherein said rotating means comprises cam arms formed in the longitudinal axes of said tip electrodes, and a sliding collar operatively connected to said body and having cam surface for engaging said cam arms.

4. A probe in accordance with claim 1 wherein said rotating means comprises lever arms formed at an angle with respect to the longitudinal axes of said tip electrodes, and a lever operatively connected to said body and having slots therein for engaging said lever arms.

* * * * *